United States Patent
Zhang et al.

(10) Patent No.: US 12,212,336 B2
(45) Date of Patent: Jan. 28, 2025

(54) METHOD AND SYSTEM FOR FAST COLUMN PROCESSING FOR HIGHLY IRREGULAR LDPC CODES

(71) Applicant: SK hynix Inc., Gyeonggi-do (KR)

(72) Inventors: Fan Zhang, Fremont, CA (US); Haobo Wang, Fremont, CA (US); Meysam Asadi, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/335,721

(22) Filed: Jun. 15, 2023

(65) Prior Publication Data
US 2024/0421832 A1    Dec. 19, 2024

(51) Int. Cl.
H03M 13/11 (2006.01)
H03M 13/00 (2006.01)
H03M 13/01 (2006.01)
H03M 13/09 (2006.01)

(52) U.S. Cl.
CPC ..... H03M 13/1128 (2013.01); H03M 13/015 (2013.01); H03M 13/096 (2013.01)

(58) Field of Classification Search
CPC ........... H03M 13/1128; H03M 13/015; H03M 13/096
See application file for complete search history.

(56) References Cited

U.S. PATENT DOCUMENTS

| | | | | |
|---|---|---|---|---|
| 7,730,377 B2 * | 6/2010 | Hocevar | ............ | H03M 13/1137 714/6.24 |
| 8,549,377 B1 * | 10/2013 | Kons | .................... | H03M 13/114 714/755 |
| 10,075,190 B2 * | 9/2018 | Achtenberg | ....... | H03M 13/1137 |
| 10,367,526 B2 * | 7/2019 | Liu | .................... | H03M 13/1171 |
| 11,218,166 B1 * | 1/2022 | Wu | .................... | H03M 13/1117 |
| 11,881,871 B1 * | 1/2024 | Zhang | ................ | H03M 13/1128 |
| 2021/0359705 A1 | 11/2021 | Zhang et al. | | |
| 2024/0154626 A1 * | 5/2024 | Wesel | ............... | H03M 13/6597 |

FOREIGN PATENT DOCUMENTS

WO      2015/012572 A1    1/2015

* cited by examiner

Primary Examiner — Justin R Knapp
(74) Attorney, Agent, or Firm — IP & T GROUP LLP

(57) ABSTRACT

Decoding method and memory system which group bits in irregular LDPC codes having similar degrees of convergence into respective degree groups, classify the degree groups according to a metric indicative of a number of decoding iterations for convergence, divide a time period for convergence of the decoding iterations into different zones for the processing of selected degree groups within each zone, and skip decoding of the bits in a non-converging zone where the bits are not converging.

20 Claims, 10 Drawing Sheets

FIG. 6C $$H = \begin{bmatrix} \overset{v_1}{1} & \overset{v_2}{1} & \overset{v_3}{1} & \overset{v_4}{0} & \overset{v_5}{0} & \overset{v_6}{0} & \overset{v_7}{0} & \overset{v_8}{0} \\ 1 & 1 & 1 & 1 & 1 & 0 & 0 & 0 \\ 0 & 0 & 0 & 1 & 1 & 1 & 1 & 0 \\ 0 & 0 & 1 & 1 & 1 & 1 & 1 & 1 \end{bmatrix} \begin{matrix} c_1 \\ c_2 \\ c_3 \\ c_4 \end{matrix}$$

METHOD AND SYSTEM FOR FAST COLUMN PROCESSING FOR HIGHLY IRREGULAR LDPC CODES

BACKGROUND

1. Field

The present invention relates to the processing of irregular low density parity check (LDPC) codes.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices. Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

The SSD may include flash memory components and a controller, which includes the electronics that bridge the flash memory components to the SSD input/output (I/O) interfaces. The SSD controller can include an embedded processor that can execute functional components such as firmware. The SSD functional components are device specific, and in most cases, can be updated. The two main types of flash memory components are named after the NAND and NOR logic gates. The individual flash memory cells exhibit internal characteristics similar to those of their corresponding gates. The NAND-type flash memory may be written and read in blocks (or pages) which are generally much smaller than the entire memory space. The NOR-type flash allows a single machine word (byte) to be written to an erased location or read independently. The NAND-type operates primarily in memory cards, USB flash drives, solid-state drives, and similar products, for general storage and transfer of data.

NAND flash manufacturers have been pushing the limits of their fabrication processes towards 20 nm and lower, which often leads to a shorter usable lifespan and a decrease in data reliability. As such, a more powerful error correction code (ECC) is required over traditional Bose-Chaudhuri-Hocquenghem (BCH) codes to overcome the associated noises and interferences, and thus improve the data integrity. One such ECC is an LDPC code.

An LDPC code can be characterized by an M×N parity-check matrix H, the column weight of the i-th ($0 \leq i < N$) column of H is the number of non-zero entries in the i-th column of the parity-check matrix H. If column weights of all columns of H are the same, the LDPC code represented by H is called a regular LDPC code. Otherwise, the LDPC code is called an irregular LDPC code. In other words, columns of the parity-check matrix H of an irregular LDPC code have different column weights.

Due to their flexibility and improved decoding performance, irregular LDPC codes are increasingly being used in a non-volatile memory system (e.g., a NAND flash memory) to ensure robust data storage and access.

In this context, embodiments of the present invention arise.

SUMMARY

In accordance with one embodiment of the invention, there is provided a method for column processing of irregular low density parity check codes. The method groups bits in irregular LDPC codes having similar degrees of convergence into respective degree groups, classifies the degree groups according to a metric indicative of a number of decoding iterations for convergence, divides a time period for convergence of the decoding iterations into different zones for the processing of selected degree groups within each zone, and skips decoding of the bits in a non-converging zone where the bits are not converging.

In accordance with another embodiment of the invention, there is provided a memory system comprising a storage and a decoder coupled to the storage and configured to: group bits in irregular LDPC codes having similar degrees of convergence into respective degree groups; classify the degree groups according to a metric indicative of a number of decoding iterations for convergence; divide a time period for convergence of the decoding iterations into different zones for the processing of selected degree groups within each zone; and skip decoding of the bits in a non-converging zone where the bits are not converging.

BRIEF DESCRIPTION OF THE DRAWINGS

FIGS. 6B and 6C are diagrams of a low-density parity check decoder nodes and a LDPC matrix in accordance with embodiments of the present invention.

DETAILED DESCRIPTION

Figure 1:
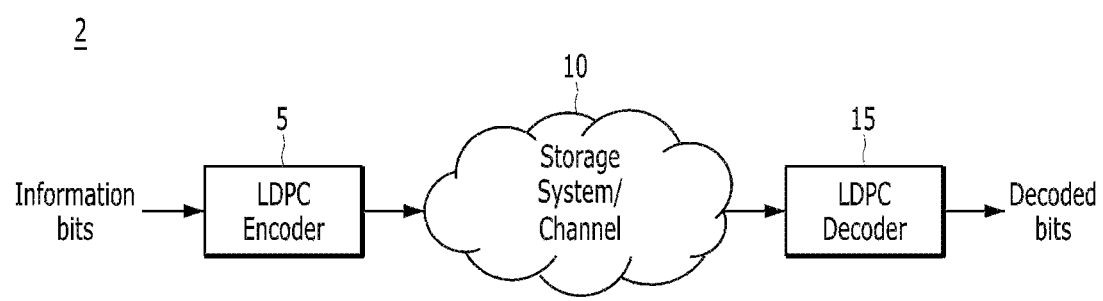
FIG. 1 is a high level block diagram illustrating an error correcting system in accordance with embodiments of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention encompasses numerous alternatives, modifications and equivalents. Numerous specific details are set forth in the following description in order to provide a thorough understanding of the invention. These details are provided for the purpose of example, and the invention may be practiced according to the claims without some or all of these specific details. For the purpose of clarity, technical material that is known in the technical fields related to the invention has not been described in detail so that the invention is not unnecessarily obscured.

FIG. 1 is a high-level block diagram illustrating an error correcting system 2, in accordance with embodiments of the present invention. More specifically, the high-level block diagram in FIG. 1 shows error correcting system 2 including an encoder 5 and a decoder 15 using for example LDPC coding and decoding algorithms. That is, error correcting system 2 may include a LDPC encoder 5 and a LDPC decoder 15, although other coding and decoding algorithms can be used.

Figure 2:
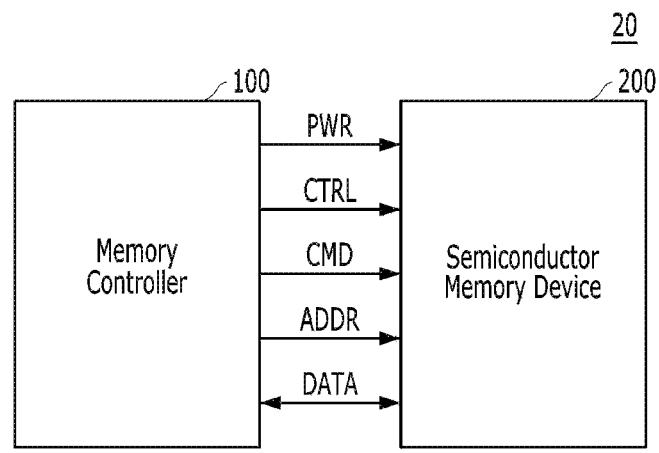
FIG. 2 is a block diagram schematically illustrating a memory system in accordance with embodiments of the present invention.

The LDPC encoder 5 may receive information bits including data which is desired to be stored in a storage system 10 (such as in memory system 20 of FIG. 2). The LDPC encoder 5 may encode the information bits to output LDPC encoded data. The LDPC encoded data from the LDPC encoder 5 may be written to a storage device or memory device of the storage system 10. In various embodiments, the storage device may include a variety of storage types or media. In some embodiments, during being written to or read from the storage device, data is transmitted and received over a wired and/or wireless channel. In this case, the errors in the received codeword may be introduced during transmission of the codeword.

When the stored data in the storage system 10 is requested or otherwise desired (e.g., by an application or user which stored the data), the LDPC decoder 15 may perform LDPC decoding data received from the storage system 10, which may include some noise or errors. In various embodiments, the LDPC decoder 15 may perform LDPC decoding using the decision and/or reliability information for the received data. The decoded bits generated by the LDPC decoder 15 are transmitted to the appropriate entity (e.g., the user or application which requested it). With proper encoding and decoding, the information bits match the decoded bits.

FIG. 2 is a block diagram schematically illustrating a memory system 20 in accordance with an embodiment of the present invention.

Referring FIG. 2, the memory system 20 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 20 is used in an SSD, operation speed of a host (not shown) coupled to the memory system 20 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 20 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 3:
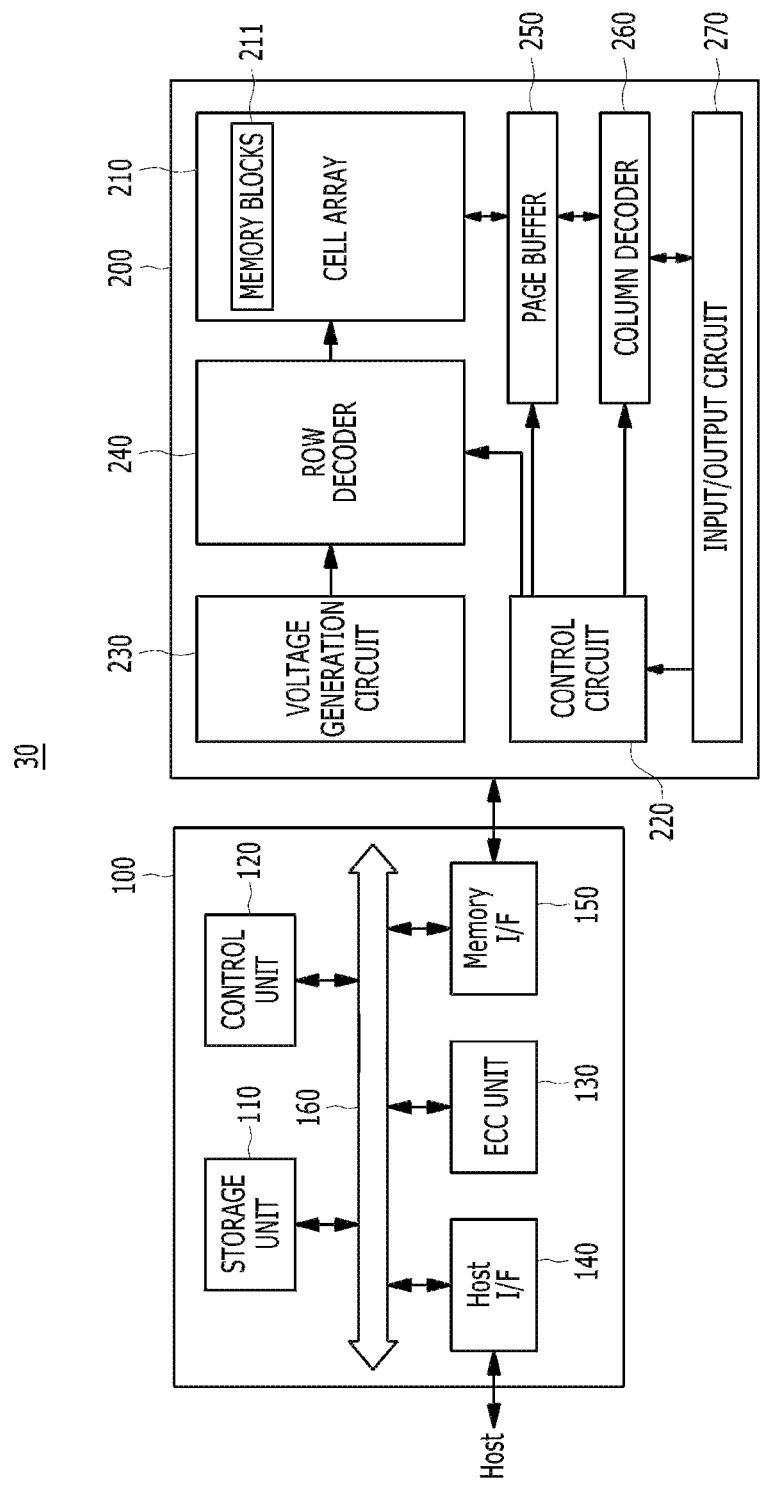
FIG. 3 is a block diagram illustrating a memory system in accordance with embodiments of the present invention.

FIG. 3 is a detailed block diagram illustrating various embodiments of memory system 30 in accordance with one embodiment of the present invention. For example, memory system 30 of FIG. 3 may depict the storage system 10 shown in FIG. 1 or the memory system 20 shown in FIG. 2.

Referring to FIG. 3, the memory system 30 may include the memory controller 100 and the semiconductor memory device 200. The memory system 30 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host. The controller 100 may provide the data read from the memory device 200, to the host, and store the data provided from the host into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

Referring to FIG. 3, the control unit 120 may control general operations of the memory system 30, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as an LDPC code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

As shown in FIG. 3, host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control unit (e.g., CPU) 120. When the memory device 200 is a flash memory such as a NAND flash memory, the memory interface 150 may generate control signals for the memory and process data under the control of the control unit 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 may be connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 4:
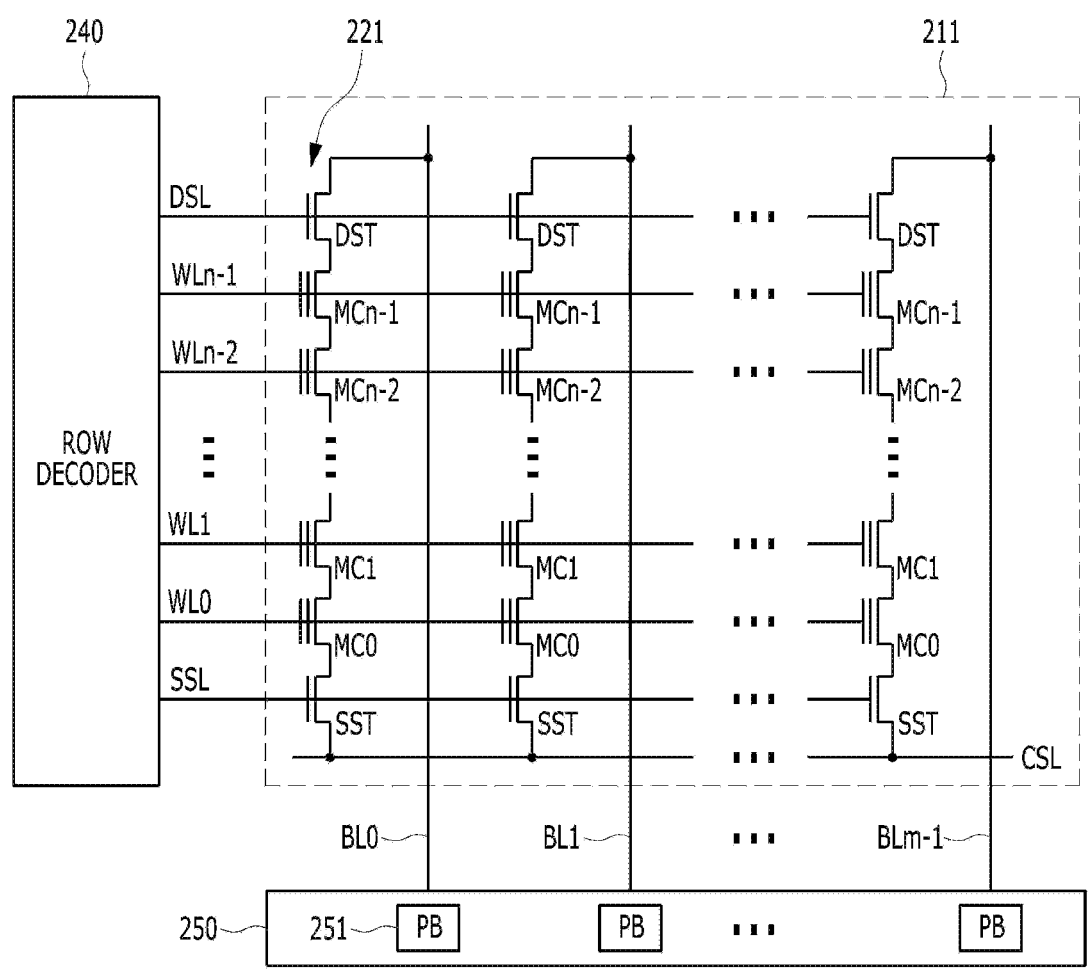
FIG. 4 is a circuit diagram illustrating a memory block of a memory device in accordance with embodiments of the present invention.

FIG. 4 is a circuit diagram illustrating a memory block of a semiconductor memory device in accordance with an embodiment of the present invention. For example, a memory block of FIG. 4 may be the memory blocks 211 of the memory cell array 210 shown in FIG. 3.

Referring to FIG. 4, the memory blocks 211 may include a plurality of cell strings 221 coupled to bit lines BL0 to BLm-1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn-1 may be formed of a multi-level cell (MLC) storing data information of multiple bits in each cell. The cell strings 221 may be electrically coupled to the corresponding bit lines BL0 to BLm-1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 5:
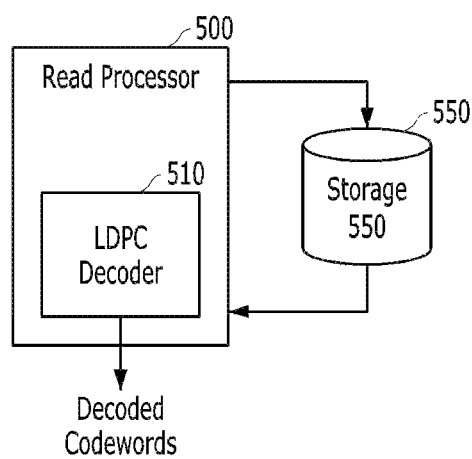
FIG. 5 is a diagram illustrating a storage system in accordance with embodiments of the present invention.

FIG. 5 is a diagram illustrating a storage system in accordance with embodiments of the present invention.

Referring to FIG. 5, the storage system may include a storage 550 and a memory controller such as a read processor 500. The read processor 500 may perform a read operation for data stored in the storage 550. During the read operation, the read processor 500 may read data from the storage 550, which may include some noise or errors, and perform error correction for the read data. In some embodiments, the read processor 500 may include a decoder, for example, the LDPC decoder 510 which may perform LDPC decoding. The read processor 500 may also perform BF decoding and MS decoding. The read processor 500 may include a receiver (not shown) for receiving data from the storage 550.

When the stored data in the storage 550 is requested or otherwise desired (e.g., by an application or user which stored the data), the LDPC decoder 510 may receive data from the storage 550. The received data may include some noise or errors. The LDPC decoder 510 may perform detection on the received data and output decision and/or reliability information. The LDPC decoder 510 may include one of a soft detector and a hard detector. Either the soft detector or the hard detector can provide channel information for decoders, such as the LDPC decoder. For example, the soft detector may output reliability information and a decision for each detected bit. On the other hand, the hard detector may output a hard decision on each bit without providing corresponding reliability information. As an example, the hard detector may output as the hard decision that a particular bit is a "1" or a "0" without indicating how certain or sure the detector is in that decision. In contrast, the soft detector may output a decision and reliability information associated with the decision. In general, reliability information indicates how certain the detector is in a given decision. In one example, a soft detector may output a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

Also, LDPC decoder 510 may perform LDPC decoding using the decision and/or reliability information. LDPC decoder 510 may include one of a soft decoder and a hard decoder. The soft decoder utilizes both the decision and the reliability information to decode the codeword. The hard decoder utilizes only the decision values to decode the codeword. The decoded bits generated by the LDPC decoder 510 are transmitted to the appropriate entity (e.g., the user or application which requested it). With proper encoding and decoding, the information bits match the decoded bits.

In various embodiments, the system shown in FIG. 5 may be implemented using a variety of techniques including an application-specific integrated circuit (ASIC), a field-programmable gate array (FPGA), and/or a general purpose processor (e.g., an Advanced RISC Machine (ARM) core).

LDPC codes may be represented by bipartite graphs. One set of nodes (e.g., the variable or bit nodes) may correspond to elements of the codeword, and the other set of nodes (e.g., check nodes) may correspond to the set of parity check constraints satisfied by the code words.

Existing Decoding Schemes

Figure 6A:
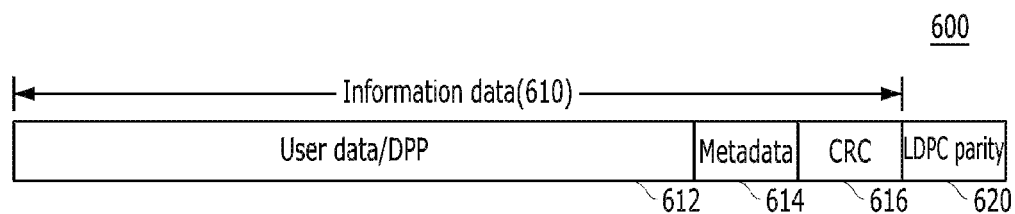
FIG. 6A is a diagram illustrating a format of a codeword to be stored in a storage system in accordance with embodiments of the present invention.

FIG. 6A is a diagram illustrating a format of a codeword 600 to be stored in a storage system. Referring to FIG. 6A, the codeword 600 may include information data 610 and parity data 620. In some embodiments, the codeword 600 may be generated by LDPC codes. In other words, the information data 610 may be protected by LDPC codes, and the parity data 620 may be LDPC parity. The information data 610 may include user data with data path protection (DPP) 612, meta-data 614 and cyclic redundancy check (CRC) parity bits 616. A CRC code which is an error-detecting code commonly used in digital networks and storage devices may detect accidental changes to raw data.

In a typical LDPC decoder, if the LDPC checksum is zero, the decoder may be terminated. The CRC parity bits 616 will be computed based on the decoded user data 612 and meta-data 614 after the LDPC decoding. If the computed CRC parity bits match the decoded CRC parity bits, decoding may be successful. Otherwise, a mis-correction may be declared.

In some embodiments of the present invention, it is supposed that $x=[x_0, x_1, \ldots, x_{N-1}]$ is a bit vector, and $H=[h_{i,j}]$ is an M×N low-density parity-check matrix with a binary value $h_{i,j}$ at the intersection of row i and column j. Then each row of H provides a parity check for x. If x is a codeword of H, it has $xH^T=0$, where $H^T$ is referred to as the syndrome.

Figure 6B:
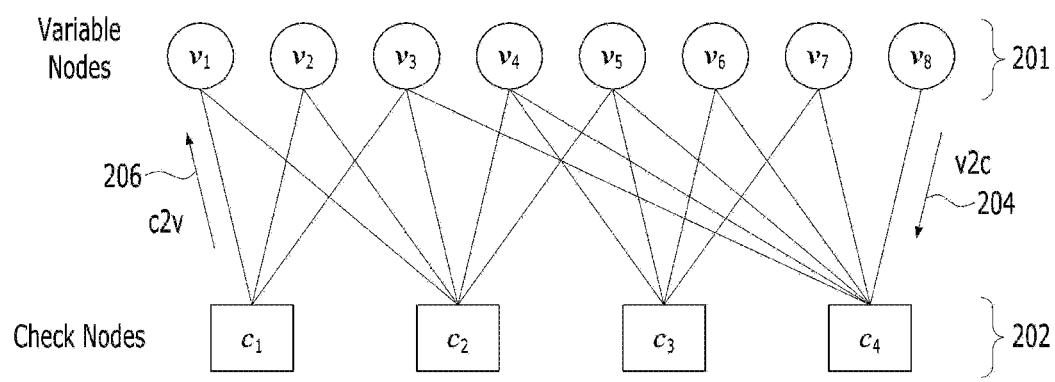

FIG. 6B is a diagram of a bipartite graph showing aspects of node communications in LDPC decoder 510. The decoder 510 includes a number of variable nodes 201, which are part of a variable node unit (VNU). A total of eight variable nodes (VNs) 201 are shown in FIG. 6B, labeled as v1-v8. The VNs 200 communicate with a series of check nodes (CNs) 202 that are part of a check node unit (CNU) described in more detail below. A total of four check nodes are shown in FIG. 6B, labeled as c1-c4. Other respective numbers and arrangements of the respective nodes 201, 202 can be provided. The lines connecting the variable nodes 201 to the check nodes represent two-way communications paths for transmitting messages therebetween. These messages may go from variable to check node as indicated by v2c direction 204 or from check to variable node, as indicated by c2v direction 206. In FIG. 6C, the number of "1s" in the corresponding rows and columns of the LDPC matrix H shown represents the interconnections between variable and check nodes in the graph of FIG. 6B.

In LDPC decoding, a syndrome update may check to see if all of the errors have been removed from the codeword. For example, if for parity check matrix H (e.g., matrix of FIG. 6C), the LDPC checksum ĉH=0, then the syndrome update can determine that decoding is successful and all errors have been removed from the codeword. If so, the LDPC decoding stops decoding and outputs ĉ=[ĉ1, ĉ2, . . . ĉN] as the decoded output.

If the LDPC checksum is not equal to zero, the decoded codeword (i.e., ĉ) is not output and another decoding iteration is performed until a maximum number of iterations, which may be predefined, is reached. In other words, the variable node update calculates new messages V2C messages and new LLR values, the check node update calculates new messages C2V messages, and the codeword update calculates a new codeword and checks if the product of the new codeword and the parity check matrix is 0, that is ĉH=0.

If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found.

With reference back to FIG. 6C, the term "weight" or "degree" as used herein refers to the number of entries in a row or a column of the H matrix that have the number "1" listed. As seen in FIG. 6C, the first row associated with c1 has a weight or degree of 3, while the second row associated with c2 has a weight or degree of 5. Viewed differently, the weight of a particular check node may also be defined as the degree of connectivity of the variable nodes to the check node, as shown in FIG. 6B, where the weight or degree of c1 would be 3 and the weight or degree of c2 would be 5.

In some embodiments, an LDPC decoding operation is performed according to bit flipping decoding. In bit-flipping decoders, the decoder may process a fixed number W of variable nodes (VN) in one clock-cycle. That is for each of the VNs to be processed in a cycle, the decoder counts the number of neighboring check nodes (CN) that are unsatisfied and compares this number with a threshold T. If the count is larger than the threshold T, the decoder flips the current bit-value of the VN. The variable nodes are each processed one-by-one from the first variable node to the last variable node.

For irregular codes, the column weight, or column degree, or number of non-zero elements in a column, can vary across different columns. The irregularity of a parity check matrix of an irregular LDPC code can be described by the column weight distribution, which describes how many bits are with what column degree etc.

Inventive MS Decoder

In a classical decoder, all bits for the codeword (c1, c2, c3, etc.) are processed in sequential order in each decoding iteration. The present invention recognized that, with such a sequential bit processing order, the remaining BER of the bits with the same degree evolves with each decoding iteration. In one embodiment of the present invention, BER is a metric used to assess the convergence behavior of bits in columns with different degrees (e.g., assessment of different convergence behaviors for v1 to v8 in FIG. 6C). According to one embodiment, v4 and v5 (with a deg=3) have a higher chance of fast convergence than v1, v2, v3, v6, v7 (with a deg=2) or v8 (with a deg=1). Accordingly, the inventive method can speed up the decoding process for irregular codes by selectively processing bits first that have a higher degree while skipping processing of bits having a lower degree that are not ready to converge (and/or are not converging). The method can be applied to any irregular codes and provides different level of improvement to throughput depending on the irregularity of the parity check matrices. However, generally speaking, 10-20% throughput improvement can be obtained with the inventive method.

Figure 7:
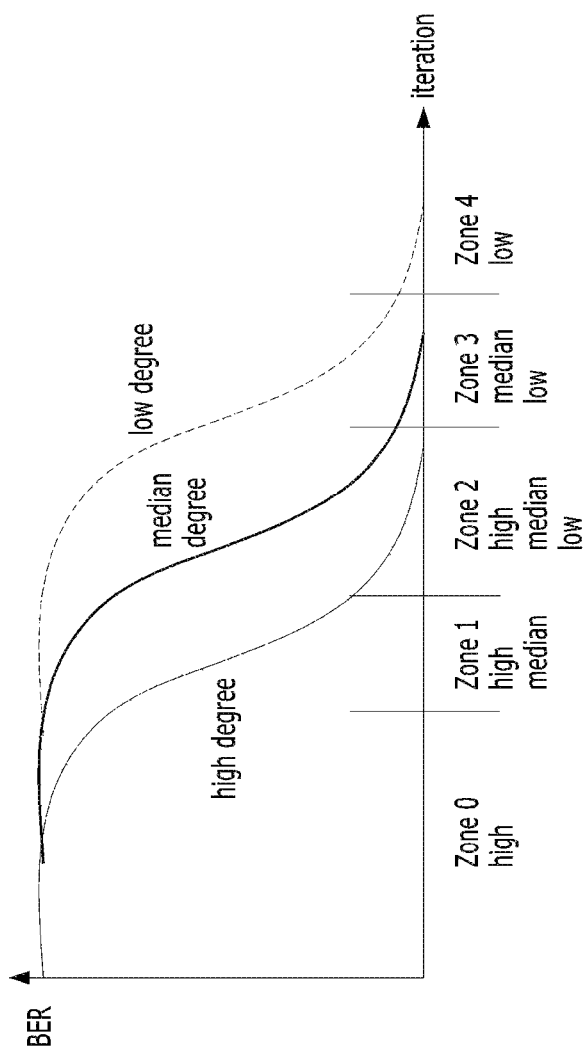
FIG. 7 is a density evolution chart for an irregular LDPC code depicting how bit error rate (BER) changes as a function of the degree (or weights) of the columns of a LDPC matrix.

In FIG. 7, the evolution of bit error rate (BER) is shown as a function of the number of decoding iterations for high, median and low degree bits. As an example, FIG. 7 shows that bits for columns with different degrees have different convergence behavior. For example, median and low degree bits start to converge after the high degree bits converge. Low degree bits always converge in the later stage(s). This pattern has been observed for irregular codes with bit-level sequential processing. The gap between the curves in FIG. 7 for different degree bits will increase as higher irregularities are used. Accordingly, in one embodiment, the processing of median and low degree bits waits until after the processing and convergence of the high degree bits.

Column Processing Skipping

The observation from FIG. 7 indicates that processing of specific bits having specific degrees can be skipped if the bits being sequential processed are not ready to converge. Skipping bits not ready to converge (or which are not converging) can save a significant number of processing cycles, and hence can improve throughput and reduce power consumption. For example, by skipping the processing bits in low degree columns in the early stage of decoding the codewords in the LDPC matrix (and/or by skipping the processing of bits in high degree columns in the late stage of decoding) can improve throughput and reduce power consumption.

Rules to Skip Processing

In one embodiment of the present invention, degrees that have similar BER convergence behavior are grouped together into respective "degree groups," and all bits in the codewords of the LDPC matrix are classified into high, median, and low degree groups representing different rates of convergence for the decoding. The present invention is not so limited, and the bits may be classified into more than three (3) groups.

In one embodiment of the present invention, the decoding can be divided in different zones representing different time periods during the decoding iterations. If three groups such as "low degree" and "median degree" and "high degree" are used, as shown in the detailed example of FIG. 7, five (5) zones may also be designated. As shown in FIG. 7, the five zones may be designated as "zone 0" where only high degree bits converge during decoding, "zone 1" where high degree and median degree bits converge, "zone 2" where high degree, median degree, and low degree bits converge, "zone 3" where median degree and low degree bits converge, and "zone 4" where only with low degree bits converge. In one embodiment of the present invention, in each zone, certain degree groups that are not converging can be skipped.

Figure 8A:
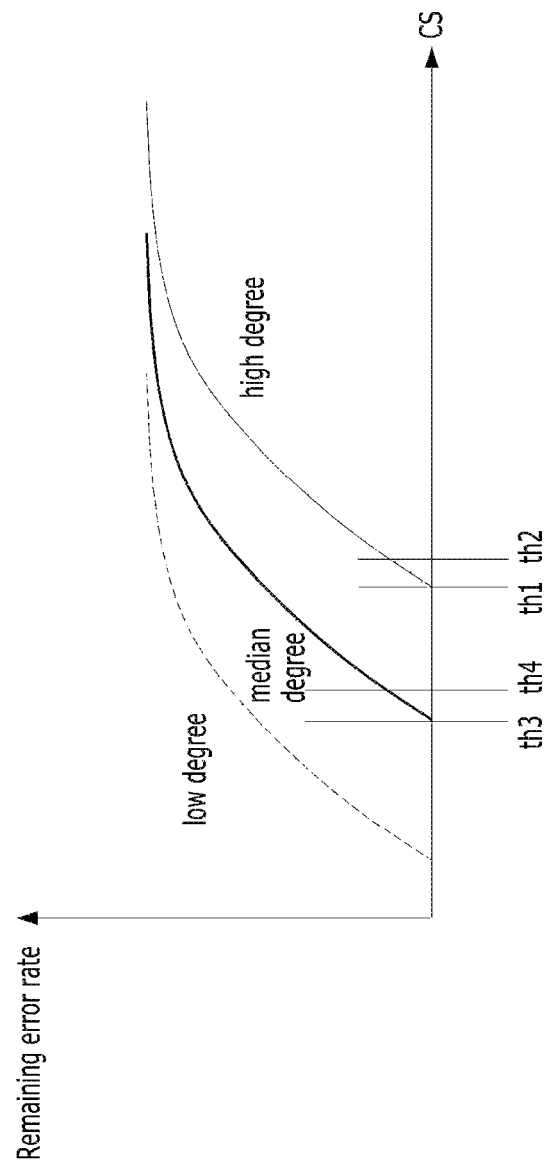
FIG. 8A is a graph depicting an alternative way according to one embodiment to skip zones when processing irregular LDPC codes.
Figure 8B:
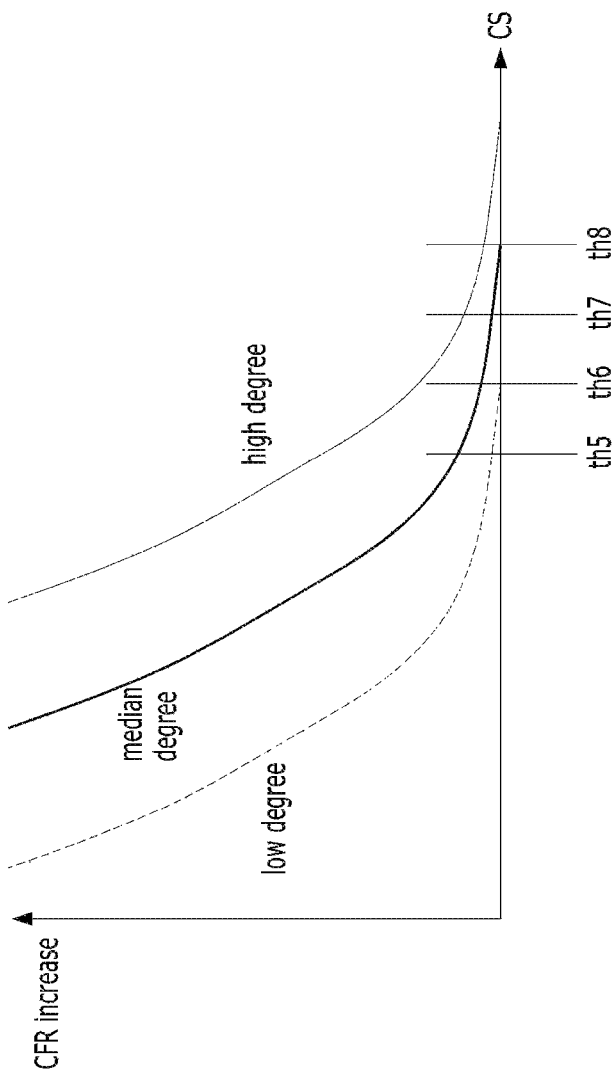
FIG. 8B is a graph depicting an alternative way according to another embodiment to skip zones when processing irregular LDPC codes.

Other ways to determine the zones are shown in FIGS. 8A and 8B.

In FIGS. 8A and 8B, statistics are collected from a decoder by decoding a specific number of codewords. For example, FIG. 8A shows the error rate per degree group vs. checksum collected over a specific number of codewords. A threshold th1 can be chosen so that when checksum cs is less than th1, decoding skips the processing of high degree groups. According to the statistics shown in FIG. 8A, there is no error left for decoding in the high degree group when checksum is less than th1, so there is no impact to correction performance. Similarly, a threshold th3 can be determined so that when checksum cs is less than th3, processing skips both high and median degree groups.

FIG. 8B shows the statistics collected from decoder by running a sequence (by sweeping of a threshold x value) of simulations by skipping processing of the low degree group when the checksum cs is greater than the given threshold x, and recording the codeword failure rate (CFR) increase for each value of the threshold x. The results in FIG. 8B show that, when the threshold x gets larger, the loss in CFR becomes smaller. A threshold th6 can be set so that there is no loss in CFR to permit low degree group skipping. Similarly, a threshold th8 can be set for median degree group skipping.

Throughput Improvement by Decoder Retry

In other embodiments, more aggressive thresholds can be chosen so that there are some codewords which can be decoded successfully if skipping is disabled (in other words, using original bit order sequential processing) may end up in decoding failure if skipping is enabled. For example, in FIG. 8A, if threshold th2, instead of threshold th1, is chosen to skip high degree group processing, one obtains more throughput improvement because most of the codewords are error free already when checksum is in between th1 and th2. The few codewords that have remaining errors when checksum is in between th1 and th2 can be re-decoded by the decoder by disabling skipping. This can often lead to a net gain in throughput. The same idea can be applied when choosing all thresholds.

Alternative Features for Skipping

Other than checksum, other criteria available to the LDPC decoder criteria be used to determine when and what degree group to skip. Such features include iteration count, bit flip count, sub-CRC, etc.

Computerized Method

Figure 9:
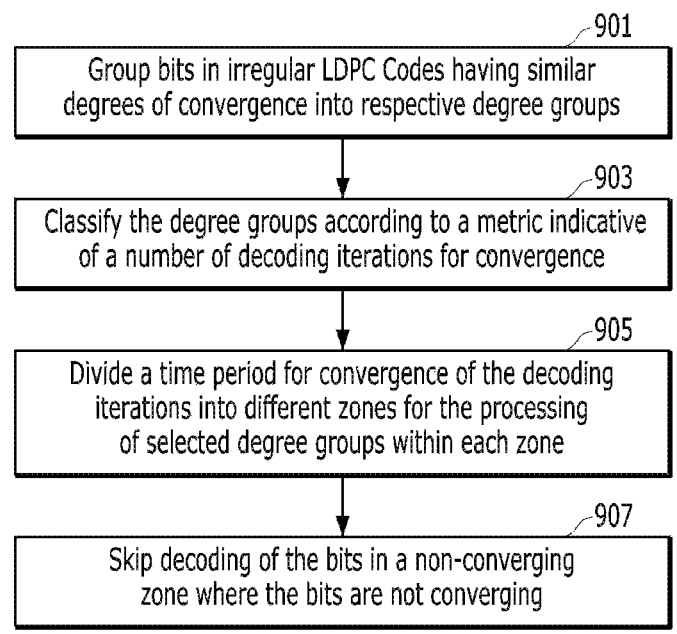
FIG. 9 is a flow chart illustrating a method for decoding data according to another embodiment of the present invention.

In one embodiment of the present invention, there is provided a decoding method (as depicted in FIG. 9) for decoding bits in irregular LDPC codes. This method may be implemented in ECC unit 130 or control circuit 220 of FIG. 3 or may be implemented in LDPC decoder 510 of FIG. 5. In this method at 901, bits in irregular LDPC codes having similar degrees of convergence are grouped into respective degree groups. At 903, the degree groups are classified according to a metric indicative of a number of decoding iterations for convergence. At 905, a time period for convergence of the decoding iterations is divided into different zones for the processing of selected degree groups within each zone. At 907, decoding of the bits in a non-converging zone (where the bits are not converging) is skipped.

In this method, the degree groups may comprise a high degree group, a median degree group, and a low degree group, wherein the high degree group convergences in less iterations than the median degree group, and wherein the median degree group convergences in less iterations than the low-degree group. For example, the low degree group may have a degree of 1 to 2 and converge in a number of iterations twice the number of iterations of the high degree group which may have a degree of 5 to 6. Further, the median-degree group may have a degree of 3 to 4 and converge in a number of iterations 1.5 times the number of iterations of the high degree group.

In this method, the metric indicative of the number of decoding iterations may comprise a bit error rate.

In this method, respective thresholds in the different zones may determine which of one or more of the degree groups to skip.

In this method, the respective thresholds may be based on one or more of bit error rate, remaining error rate, codeword failure rate, iteration count, bit flip count, and cyclic redundancy check.

In this method, statistics on a memory device may be determined (e.g., through simulations). In one embodiment, the statistics collected may assess a remaining error rate per degree group vs. a checksum collected over a given number of codewords. In another embodiment, the statistics collected may assess a codeword failure rate (CFR) per degree group vs. checksum collected over a given number of codewords.

In this method, one of the respective thresholds may comprise a first checksum threshold in which the decoding of the high degree groups is skipped when a checksum for decoded bits is less than the first checksum threshold.

In this method, one of the respective thresholds may comprise a second checksum threshold in which both the high degree groups and the median degree groups are skipped when a checksum for decoded bits is less than the second checksum threshold.

In this method, one of the respective thresholds may comprise a first codeword failure rate threshold in which the decoding of the low degree groups is skipped when a codeword failure rate for decoded bits is greater than the first codeword failure rate threshold.

In this method, one of the thresholds may comprise a second codeword failure rate threshold in which the decoding of the median degree groups is skipped when a codeword failure rate is greater than the second codeword failure rate threshold.

In this method, two of the respective thresholds may comprise a third codeword failure rate threshold and a fourth codeword failure rate threshold greater than the first and second codeword failure rate thresholds, wherein the bits having a codeword failure rate in between the third codeword failure rate threshold and the fourth codeword failure rate threshold degree groups are re-decoded while skipping is disabled.

Memory System

In another embodiment of the present invention, there is provided a memory system (such as in FIG. 3) having a storage (such as for example storage 550 in FIG. 5) and a decoder (such as for example LDPC decoder 510) coupled to the storage. The decoder is configured to: group bits in irregular LDPC codes having similar degrees of convergence into respective degree groups; classify the degree groups according to a metric indicative of a number of decoding iterations for convergence; divide a time period for convergence of the decoding iterations into different zones for the processing of selected degree groups within each zone; and skip decoding of the bits in a non-converging zone where the bits are not converging.

In this memory system, the degree groups may comprise a high degree group, a median degree group, and a low degree group, wherein the high degree group convergences in less iterations than the median degree group, and wherein the median degree group convergences in less iterations than the low degree group.

In this memory system, the metric indicative of the number of decoding iterations may comprise a bit error rate.

In this memory system, the decoder may be configured to determine, for respective thresholds in the different zones, which of one or more of the degree groups to skip.

In this memory system, the respective thresholds may be based on one or more of bit error rate, remaining error rate, codeword failure rate, iteration count, bit flip count, sub-CRC.

In this memory system, the decoder may be configured to determine statistics on a memory device (e.g., through simulations). In one embodiment, the statistics collected may assess a remaining error rate per degree group vs. a checksum collected over a given number of codewords. In another embodiment, the statistics collected may assess a codeword failure rate (CFR) per degree group vs. checksum collected over a given number of codewords.

In this memory system, one of the respective thresholds may comprise a first checksum threshold in which the decoding of the high degree groups is skipped when a checksum for decoded bits is less than the first checksum threshold.

In this memory system, one of the respective thresholds may comprise a second checksum threshold in which both the high degree groups and the median degree groups are skipped when a checksum for decoded bits is less than the second checksum threshold.

In this memory system, one of the respective thresholds may comprise a first codeword failure rate threshold in which the decoding of the low degree groups is skipped when codeword failure rate for decoded bits is greater than the first codeword failure rate threshold.

In this memory system, one of the thresholds may comprise a second codeword failure rate threshold in which the decoding of the median degree groups is skipped when a codeword failure rate is greater than the second codeword failure rate threshold.

In this memory system, two of the respective thresholds may comprise a third codeword failure rate threshold and a fourth codeword failure rate threshold greater than the first and second codeword failure rate thresholds, wherein the bits having a codeword failure rate in between the third codeword failure rate threshold and the fourth codeword failure rate threshold degree groups are re-decoded while skipping is disabled.

Although the foregoing embodiments have been described in some detail for purposes of clarity of understanding, the invention is not limited to the details provided. There are many alternative ways of implementing the invention. The disclosed embodiments are illustrative and not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for column processing of irregular low density parity check (LDPC) codes, comprising:
   grouping bits in irregular LDPC codes having similar degrees of convergence into respective degree groups;
   classifying the degree groups according to a metric indicative of a number of decoding iterations for convergence;
   dividing a time period for convergence of the decoding iterations into different zones for processing of selected degree groups within each zone; and
   skipping decoding of the bits in a non-converging zone where the bits are not converging.

2. The method of claim 1, wherein the degree groups comprise a high degree group, a median degree group, and a low degree group, wherein the high degree group convergences in less iterations than the median degree group, and wherein the median degree group convergences in less iterations than the low degree group.

3. The method of claim 1, wherein the metric indicative of the number of decoding iterations for convergence comprises a bit error rate.

4. The method of claim 1, wherein the decoder is configured to determine, for respective thresholds in the different zones, which of one or more of the degree groups to skip.

5. The method of claim 4, wherein the respective thresholds are based on one or more of bit error rate, remaining error rate, codeword failure rate, iteration count, bit flip count, and cyclic redundancy check.

6. The method of claim 4, further comprising determining statistics on a memory device, wherein the statistics collected assess a remaining error rate per degree group versus a checksum collected over a given number of codewords.

7. The method of claim 4, further comprising determining statistics on a memory device, wherein the statistics collected assess a codeword failure rate (CFR) per degree group versus checksum collected over a given number of codewords.

8. The method of claim 4, wherein two of the respective thresholds comprise a first checksum threshold in which decoding of the high degree group is skipped when a checksum for decoded bits is less than the first checksum threshold and a second checksum threshold in which both the high degree group and the median degree groups are skipped when the checksum for the decoded bits is less than the second checksum threshold.

9. The method of claim 4, wherein two of the respective thresholds comprises a first codeword failure rate threshold in which decoding of the low degree groups is skipped when a codeword failure rate for decoded bits is greater than the first codeword failure rate threshold and a second codeword failure rate threshold in which the decoding of the median degree groups is skipped when the codeword failure rate for decoded bits is greater than the second codeword failure rate threshold.

10. The method of claim 9, wherein two of the respective thresholds comprises a third codeword failure rate threshold and a fourth codeword failure rate threshold greater than the first and second codeword failure rate thresholds, wherein the bits having a codeword failure rate in between the third codeword failure rate threshold and the fourth codeword failure rate threshold degree groups are re-decoded while skipping is disabled.

11. A memory system, comprising:
   a storage; and
   a decoder coupled to the storage and configured to:
      group bits in irregular LDPC codes having similar degrees of convergence into respective degree groups;
      classify the degree groups according to a metric indicative of a number of decoding iterations for convergence;
      divide a time period for convergence of the decoding iterations into different zones for processing of selected degree groups within each zone; and
      skip decoding of the bits in a non-converging zone where the bits are not converging.

12. The memory system of claim 11, wherein the degree groups comprise a high degree group, a median degree group, and a low degree group, wherein the high degree group convergences in less iterations than the median degree group, and wherein the median degree group convergences in less iterations than the low degree group.

13. The memory system of claim 11, wherein the metric indicative of the number of decoding iterations comprises a bit error rate.

14. The memory system of claim 11, wherein the decoder is configured to determine, for respective thresholds in the different zones, which of one or more of the degree groups to skip.

15. The memory system of claim 14, wherein the respective the thresholds are based on at least one or more of bit error rate, remaining error rate, codeword failure rate, iteration count, bit flip count, and cyclic redundancy check.

16. The memory system of claim 14, wherein the decoder is configured to determine statistics on a memory device, and wherein the statistics collected assess a remaining error rate per degree group versus a checksum collected over a given number of codewords.

17. The memory system of claim 14, wherein the decoder is configured to determine statistics on a memory device, and wherein the statistics collected assess a codeword failure rate (CFR) per degree group versus checksum collected over a given number of codewords.

18. The memory system of claim 14, wherein two of the respective thresholds comprises a first checksum threshold in which decoding of the high degree groups is skipped when a checksum for decoded bits is less than the first checksum threshold and a second checksum threshold in which both the high degree groups and the median degree groups are skipped when the checksum for decoded bits is less than the second checksum threshold.

19. The memory system of claim 14, wherein two of the respective thresholds comprises a first codeword failure rate threshold in which decoding of the low degree groups is skipped when codeword failure rate for decoded bits is greater that the first codeword failure rate threshold and a second codeword failure rate threshold in which the decoding of the median degree groups is skipped when the codeword failure rate for the decoded bits is greater than the second codeword failure rate threshold.

20. The memory system of claim 19, wherein two of the respective thresholds comprises a third codeword failure rate threshold and a fourth codeword failure rate threshold greater than the first and second codeword failure rate thresholds, wherein the bits having a codeword failure rate in between the third codeword failure rate threshold and the fourth codeword failure rate threshold degree groups are re-decoded while skipping is disabled.

* * * * *